United States Patent
Kuo et al.

(10) Patent No.: US 6,787,416 B2
(45) Date of Patent: Sep. 7, 2004

(54) NON VOLATILE EMBEDDED MEMORY WITH POLY PROTECTION LAYER

(75) Inventors: Tung-Cheng Kuo, Lo-Tung City I-Lan (TW); Chien-Hung Liu, Taipei (TW); Shyi-Shuh Pan, Kao-Hsiung (TW); Shou-Wei Hung, Chi-Lung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/253,039

(22) Filed: Sep. 24, 2002

(65) Prior Publication Data

US 2004/0056319 A1 Mar. 25, 2004

(51) Int. Cl.⁷ .............................................. H01L 21/336
(52) U.S. Cl. ...................... 438/258; 438/257; 438/275
(58) Field of Search ................................ 438/257, 258, 438/275

(56) References Cited

U.S. PATENT DOCUMENTS

| | | | | |
|---|---|---|---|---|
| 6,033,958 A | * | 3/2000 | Chou et al. | 438/275 |
| 6,087,225 A | * | 7/2000 | Bronner et al. | 438/275 |
| 6,207,509 B1 | * | 3/2001 | Inoue | 438/275 |
| 6,346,442 B1 | * | 2/2002 | Aloni et al. | 438/258 |
| 6,551,884 B2 | * | 4/2003 | Masuoka | |

* cited by examiner

Primary Examiner—Long Pham
(74) Attorney, Agent, or Firm—Ernest J. Beffel, Jr.; Haynes Beffel & Wolfeld LLP

(57) ABSTRACT

The present invention includes devices and methods to form non-volatile memory cells and peripheral devices, with reduced damage to the electron trapping layer and, optionally, reduced thermal exposure during CMOS processing. Particular aspects of the present invention are described in the claims, specification and drawings.

9 Claims, 8 Drawing Sheets

NON VOLATILE EMBEDDED MEMORY WITH POLY PROTECTION LAYER

BACKGROUND OF THE INVENTION

In non-volatile memory production, an electron trap layer comprising ONO is easily damaged during formation of periphery devices. The non-volatile memory cells and ONO layer typically are formed before CMOS processing used to form peripheral devices, exposing the cells to thermal damage. The thermal cycles in CMOS processing also cause dopants used in buried bit lines to diffuse, which limits the manufacturer's ability to shrink feature sizes.

Accordingly, an opportunity arises to devise methods and structures that reduce damage to an electron trapping layer and to reduce thermal exposure during CMOS processing.

SUMMARY OF THE INVENTION

The present invention includes devices and methods to form non-volatile memory cells and peripheral devices, with reduced damage to the electron trapping layer and, optionally, reduced thermal exposure during CMOS processing. Particular aspects of the present invention are described in the claims, specification and drawings.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Manufacturing flash memory includes formation of the charge trapping layer, in which an electrical charge representing a value is stored. The charge trapping layer is often a multilayer structure comprising materials such as ONO. The charge trapping layer is relatively fragile, and subject to damage during fabrication of periphery devices. Manufacturing flash memory further includes formation of bit lines as buried structures between and under the non-volatile memory structures. These bit lines typically are formed by implantation of dopants and typically are formed prior to the fabrication of periphery devices.

Figure 1:
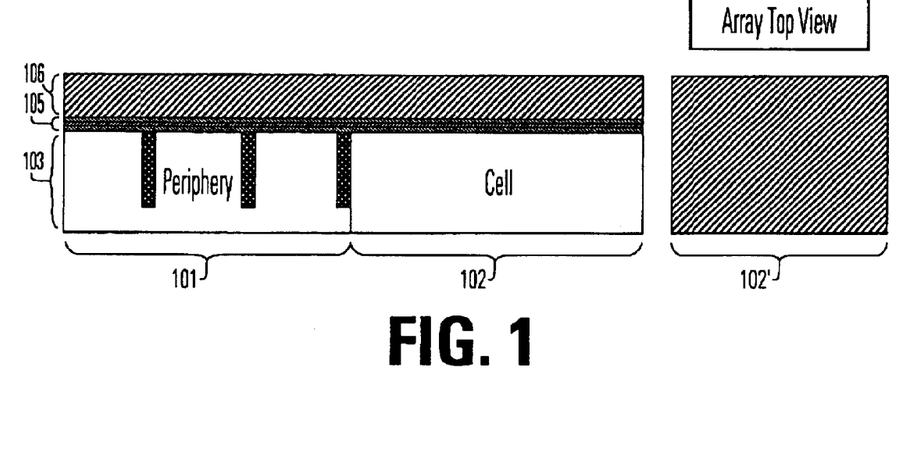
FIGS. 1-15 are cross-section and top views illustrating steps of a first embodiment of a process for manufacturing non-volatile memory cells and periphery devices. In general, figure numbering carries from one figure to the next. The numbering typically is applied to new or changed features, so that the new or changed features of the figures will be more readily apparent.

The first embodiment of a process for manufacturing non-volatile memory cells and periphery devices on a single chip is illustrated in FIGS. 1-15. In FIG. 1, a substrate 103 can roughly be divided into one or more regions for formation of periphery devices 101 and one or more regions for formation of non-volatile memory cells 102. An aerial view of the non-volatile memory cell array or cell region is labeled 102'. In the periphery device region, isolation structures 104 are formed. In this particular example, the isolation structures defined three sub-regions in which devices having different voltage and current characteristics are formed. Over the substrate and isolation structures, an ONO layer 105 is formed. Alternatively, the ONO layer could be formed over a different base layer, rather than a substrate. Over the ONO layer, a poly-crystalline silicon layer is formed 106. Alternatively, a different material might be applying that would protect the ONO layer during creation of the periphery devices. After the poly layer has been formed, the aerial view shows poly covering the entire cell region 102'.

Figure 2:
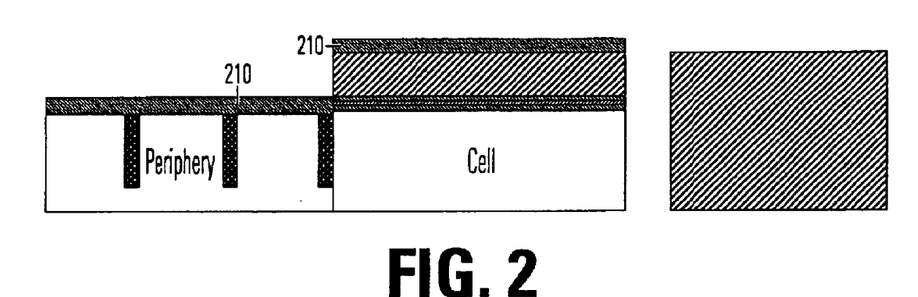

FIG. 2 depicts additional processing steps. The poly layer 106 has been partially removed by a conventional process, such as dry etching. The ONO layer has also been removed in the periphery region. A sacrificial oxide layer 210 has been formed over both the periphery region 101 and the cell region 102. Alternatively, another form of protective oxide may be form, preferably by deposition instead of thermal growth, thereby reducing the thermal stress on the cell region. After the sacrificial oxide layer 210 has been formed, the aerial view shows sacrificial oxide covering the entire cell region 102'.

Figure 3:
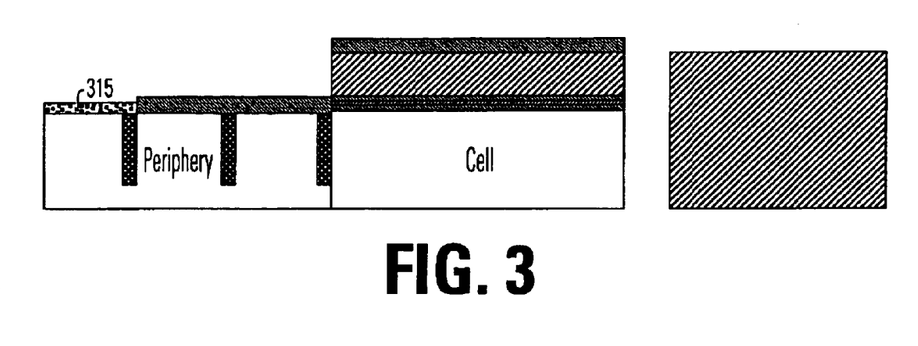

FIG. 3 depicts the formation of a gate oxide that has a capacity for handling a relatively high voltage and current. The HV Gox 315 is depicted in an isolated sub-region furthest from the cell region 102'. One manner of preparing this gate oxide is to apply dopants to part of the sacrificial oxide 315 and etching back that region 315 to the desired thickness before patterning it. Another manner of preparing this gate oxide is to etch back the sacrificial oxide and form a new oxide in the region to serve as a gate oxide.

Figure 4:
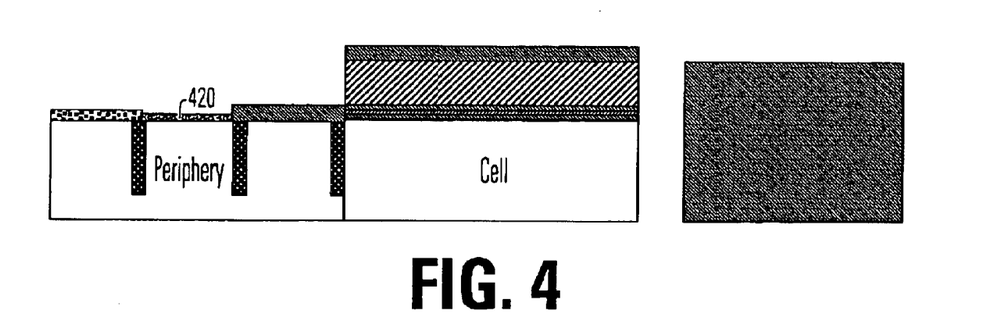

FIG. 4 depicts formation of a thick gate oxide layer 420 in the middle of the three periphery device sub-regions. This thick gate oxide 420 handles an intermediate voltage and current. The manners of preparing this thick Gox are similar to the manners of preparing an HV Gox.

Figure 5:
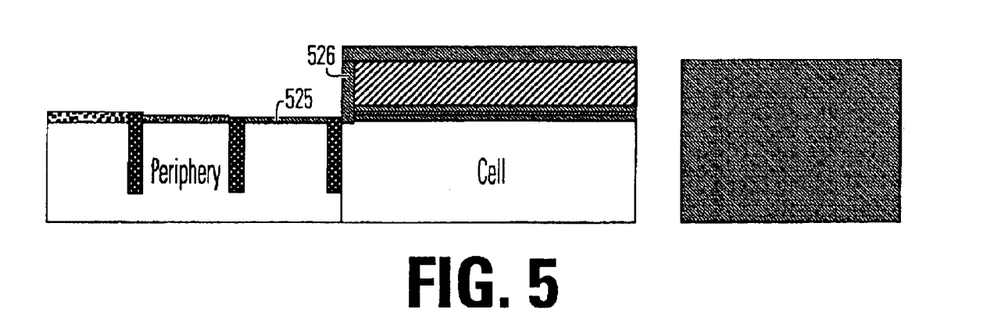
Figure 6:
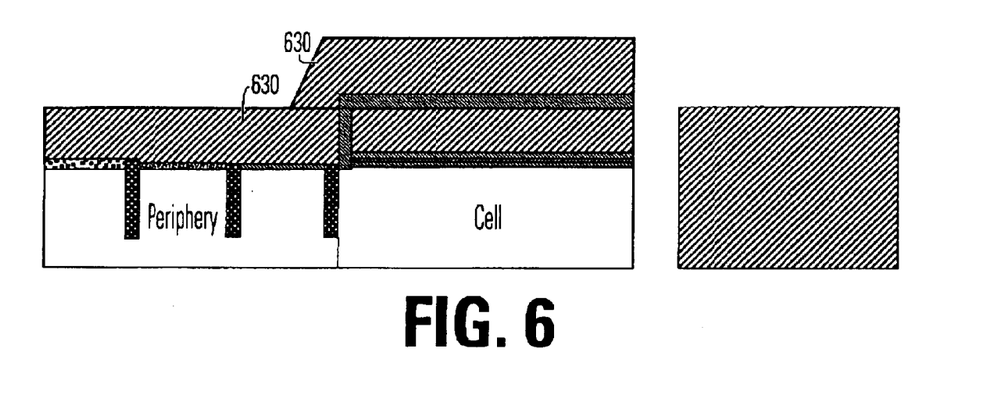

In FIG. 5, a thin Gox 525 and a sidewall sacrificial oxide 526 are created. This thin gate oxide 525 handles a reduced voltage and current. The manners of preparing this thin Gox are similar to the manners of preparing an HV Gox.

The periphery Gox formation steps illustrated in FIGS. 3-5 depict formation of periphery devices. The point of these illustrations is that periphery devices are formed while the ONO layer is protected. Optionally, low thermal stress processes, such as doping of a deposited oxide, could be used to form gate oxides, further reducing the thermal stress to the ONO layer. A second poly layer 630 is applied over the periphery and cell regions in FIG. 6.

Figure 7:
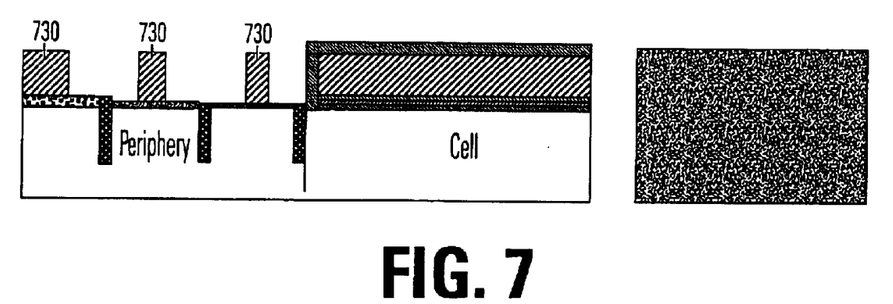
Figure 8:
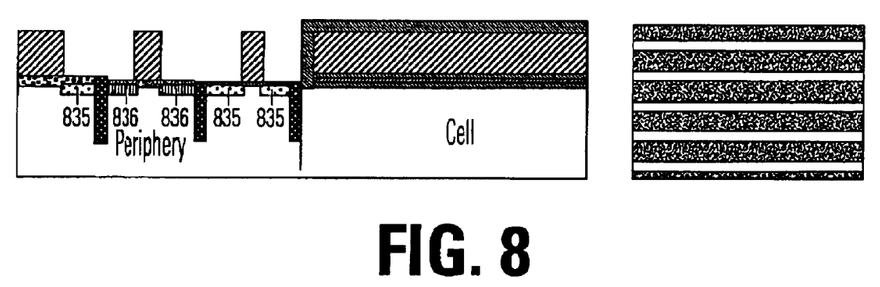

FIG. 7 depicts patterning the second poly layer to form gates in the periphery region. Patterning the polysilicon layer is followed by doping of sources/drains. The sources and drains may be P-type doped 835, N-type doped 836 or both. At this stage, light doping may be used, to be followed by subsequent heavier doping. The word lines can then be masked and etched through the sacrificial oxide in the cell region 102'.

Figure 9:
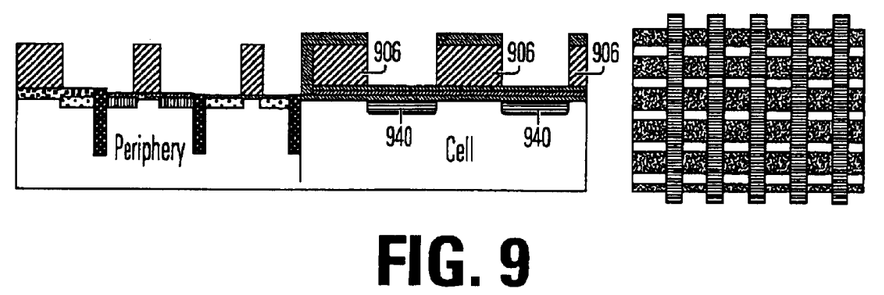

In FIG. 9, the cell region is masked and etched 906 in preparation for formation of bit lines. A first bit line ion implant 940 is provided. This implant may be performed through a section of the ONO layer that will not subsequently be used for charge storage. Implantation follows the formation of gate oxides in the periphery region, thereby minimizing thermal stress that causes diffusion of bit lines in the cell region.

Figure 10:
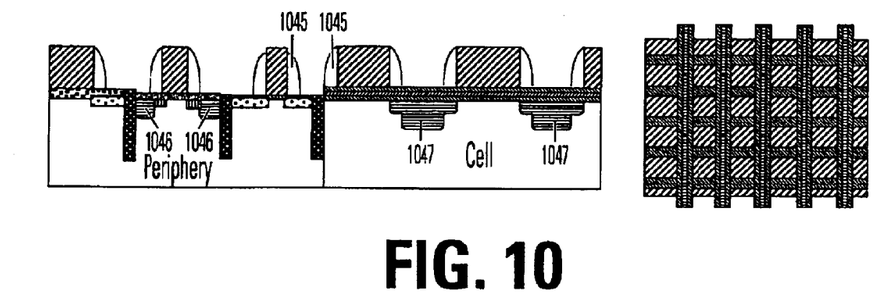
Figure 11:
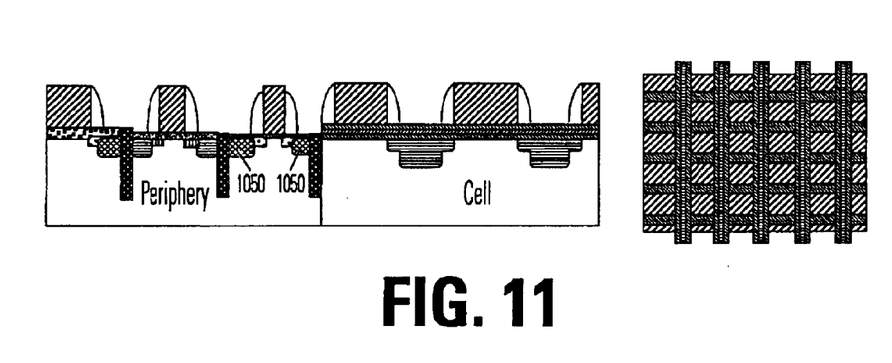

In FIG. 10, spacers 1045 are formed along the sides of the gate oxides 730, 906 by conventional methods. The spacers influence the pattern of additional doping 246, 247 in both the periphery and cell regions. The additional doping may be a heavier doping than the first doping in FIG. 8. Similarly, in FIG. 11, additional photomasking and ion implementation are carried out 1150 using conventional photomasking and implantation techniques.

Figure 12:
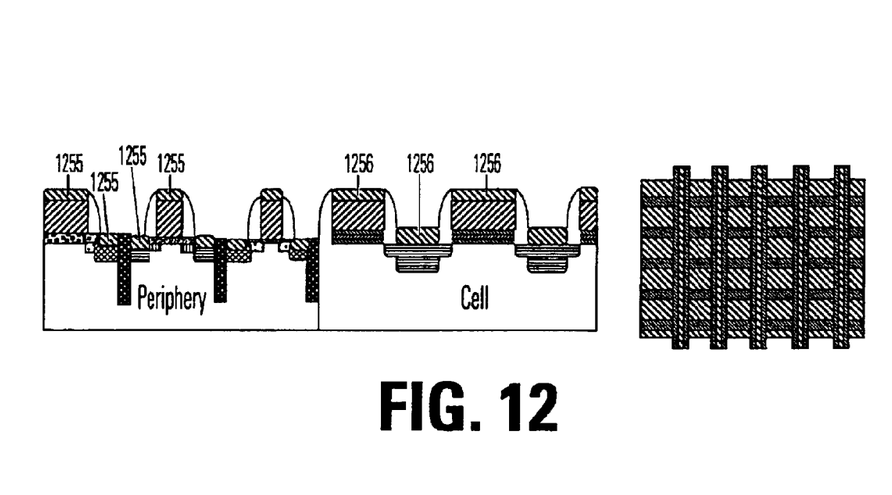

FIG. 12 depicts formation of silicide regions in the periphery region 1255 and the cell region 1256. A formation of the silicide structures reduces the resistance of the bit line. Reduced resistance can translate into enhanced operating speed.

Figure 13:
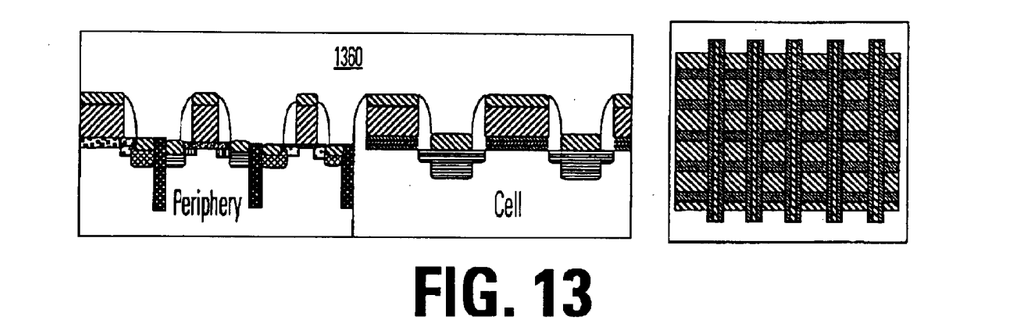
Figure 14:
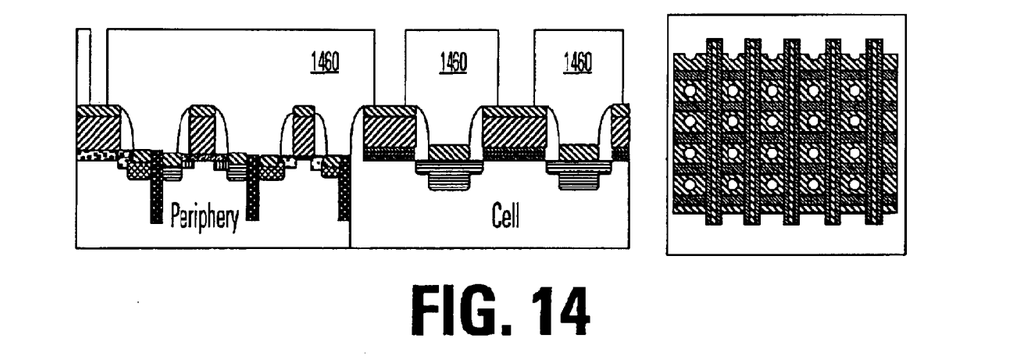
Figure 15:
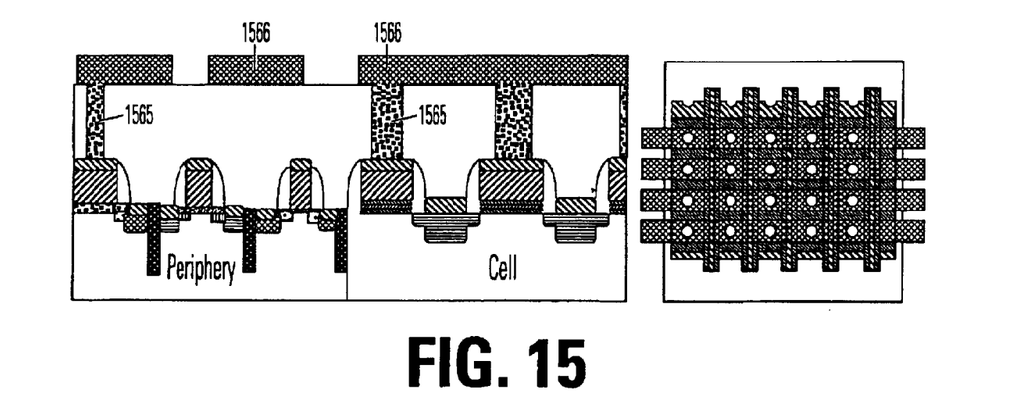

In FIG. 13, a BPSG layer 1360 is formed over periphery and cell regions. In FIG. 14, this layer 1460 is etched to form contact vias. Subsequent processing may include filling the contact vias with contact plugs, applying a metal slab 1566, and patterning and etching the metal slab.

Figure 16:
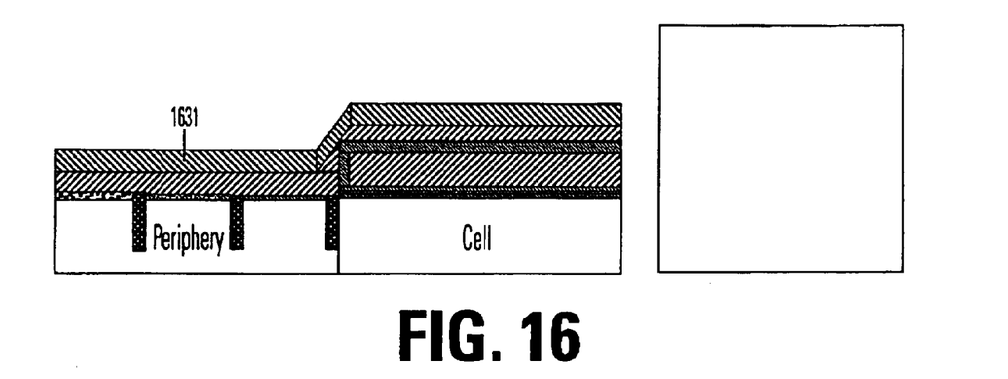
FIGS. 16-22 are cross-sections illustrating steps of the second embodiment.
Figure 17:
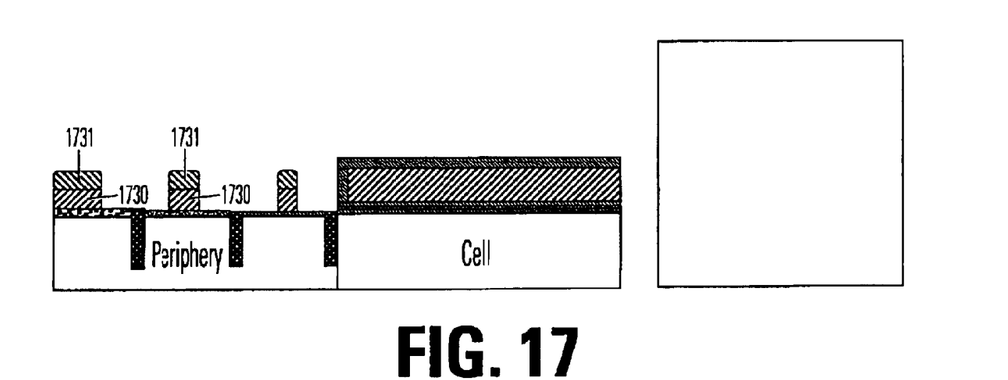

The second embodiment of a process for fabricating memory cells and periphery devices is illustrated in FIGS. 16-22. In this second embodiment, the initial steps are substantially the same as illustrated in FIGS. 1-5, above. After formation of gate oxides, as illustrated in FIG. 16, a polysilicon layer 630 and an additional SiW layer 1631 are formed over previously created structures. While the figure illustrates deposition of the polysilicon and additional SiW layers over both periphery and cell regions, is not necessary than these layers be grown beyond the periphery region. In FIG. 17, the periphery region is patterned and the polysilicon and additional SiW layers are etched back. The patterning and etching produce multilayer structures 1730, 1731.

Figure 18:
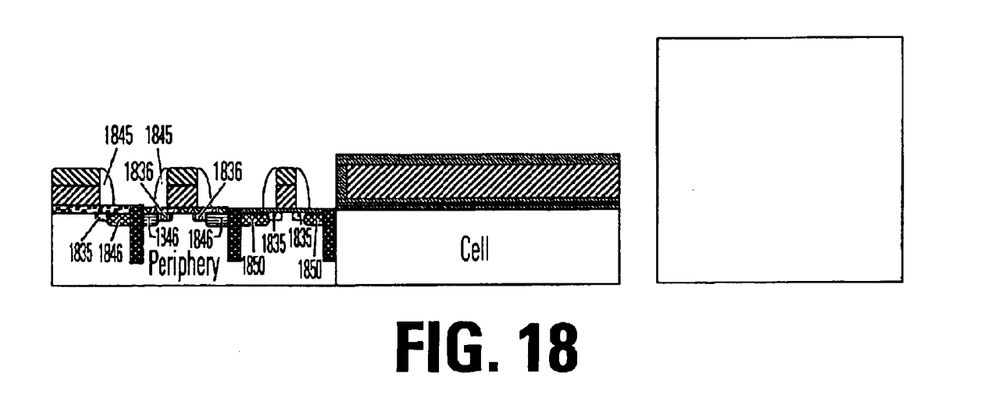
Figure 19:
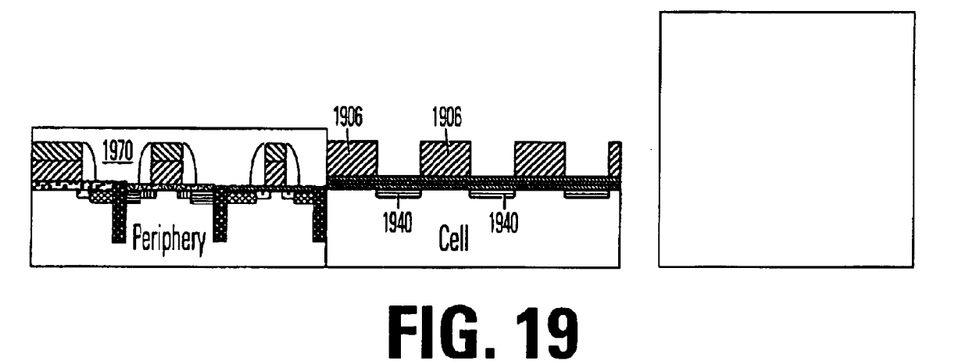
Figure 20:
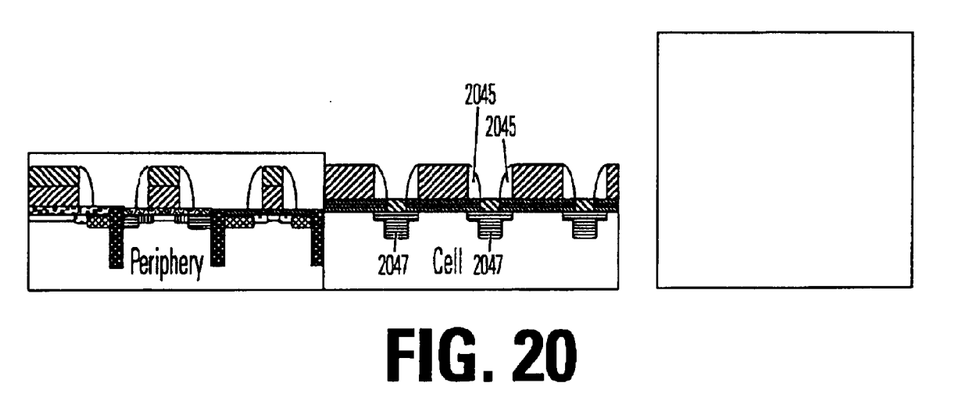

FIG. 18 depicts the formation of spacers 1845 and implantation of ions. Implantation of both P-type and N-type ions is illustrated. The N-type ions may be implanted in two steps, 1850, 1835. The P-type ions similarly may be implanted in two steps 1846, 1836. One or more protective layers over the cell region protect polysilicon and ONO layers from implantation. In FIG. 19, a BPSG layer 1970 is applied over the periphery region. The cell region is patterned to form polysilicon gates 1906. Formation of bit lines through the ONO layer begins 1940. In FIG. 20, spacers 2045 are formed in the cell region, followed by an additional ion implantation. Following these steps forms a ladderstep bit line, which may optionally be covered with a silicide, as illustrated in FIGS. 12-15.

Figure 21:
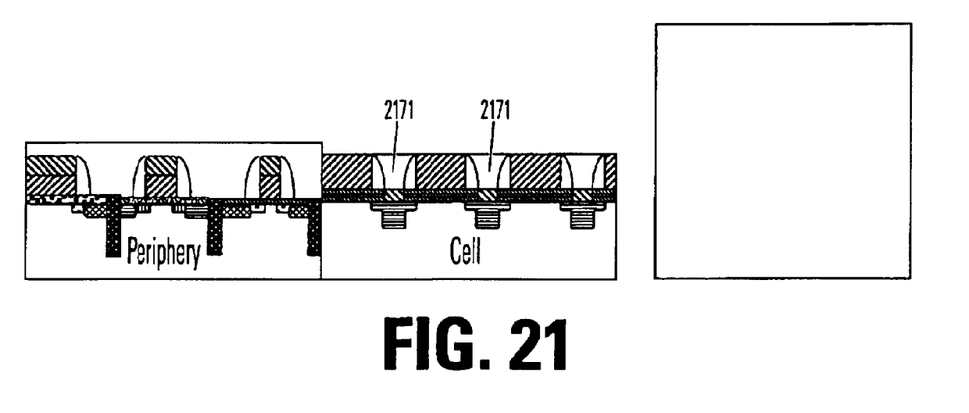
Figure 22:
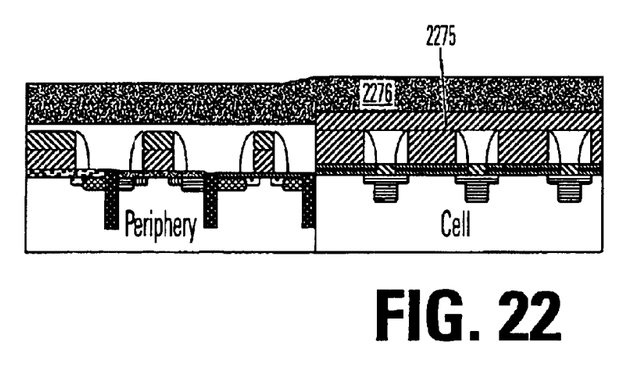

In FIG. 21 a fill layer is added 2171. An additional polysilicon layer 2275 may be used to form word lines. The BPSG layer 2276 is formed over the periphery and cell regions.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim as follows:

1. A method for fabricating a non-volatile memory and periphery devices, comprising:
   providing a substrate having a memory cell region and a periphery region;
   forming a charge trapping layer over at least part of the memory cell region;
   forming a first gate layer over at least part of the charge trapping layer;
   forming at least a gate oxide and a second gate layer in the periphery region; and then
   patterning the first gate layer to form a plurality of memory gates,
   further including forming a plurality of bit lines in both the periphery and cell regions, including;:
   implanting a first dopant in the substrate;
   forming sidewall spacers; and
   implanting a second dopant between the spacers to form a plurality of ladder bit lines.

2. The method of claim 1, further including applying a salicide process and forming self-aligned silicide structures over at least some of the ladder bit lines.

3. The method of claim 1, further including applying a salicide process and forming self-aligned silicide structures over at least part of the patterned first and second gate layers.

4. The method of claim 2, wherein the step of applying a salicide process further includes forming the self-aligned silicide over at least part of the patterned first and second gate layers.

5. The method of claim 4, further including forming a metal word line over the patterned first gate layer, wherein the metal word line is electrically connected with the self-aligned salicide over the patterned first gate layer in the memory cell region.

6. The method of claim 4, further including forming a metal word line over the patterned first gate layer, wherein the metal word line is electrically connected with the memory gates.

7. A method of claim 1, further including:
   forming a conductive layer aver the second gate layer in the periphery region;
   patterning the conductive layer and the second gate layer to form a plurality of stacks; and
   forming a plurality of additional bit lines in the substrate in the periphery region.

8. The method of claim 7, wherein the conductive layer comprises SiW.

9. The method of claim 7, wherein the step of forming the additional bit lines comprises:
   implanting a first dopant;
   forming spacers along sidewalls of the stacks; and
   implanting a second dopant between the sidewalls.

* * * * *